United States Patent
Zitzlsperger et al.

(10) Patent No.: US 8,629,549 B2
(45) Date of Patent: Jan. 14, 2014

(54) CARRIER BODY FOR A SEMICONDUCTOR COMPONENT, SEMICONDUCTOR COMPONENT AND METHOD FOR PRODUCING A CARRIER BODY

(75) Inventors: Michael Zitzlsperger, Regensburg (DE); Stefanie Marion Muetzel, Traunstein (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 102 days.

(21) Appl. No.: 13/126,761

(22) PCT Filed: Oct. 22, 2009

(86) PCT No.: PCT/DE2009/001484
§ 371 (c)(1),
(2), (4) Date: Aug. 11, 2011

(87) PCT Pub. No.: WO2010/048926
PCT Pub. Date: May 6, 2010

(65) Prior Publication Data
US 2012/0098110 A1  Apr. 26, 2012

(30) Foreign Application Priority Data
Oct. 28, 2008 (DE) .......................... 10 2008 053 489

(51) Int. Cl.
*H01L 23/48* (2006.01)
(52) U.S. Cl.
USPC .... 257/692; 257/666; 257/773; 257/E23.004; 257/E23.046; 438/123
(58) Field of Classification Search
USPC .......... 257/666–677, E23.031–E23.059, 678, 257/706, 773, 738, E23.004, 257/E23.043–E23.05; 438/123
See application file for complete search history.

(56) References Cited

U.S. PATENT DOCUMENTS

| | | | |
|---|---|---|---|
| 6,061,251 A | 5/2000 | Hutchison et al. | |
| 6,184,575 B1 * | 2/2001 | Chillara et al. | 257/692 |
| 7,298,026 B2 * | 11/2007 | Shim et al. | 257/666 |
| 7,410,830 B1 | 8/2008 | Fan et al. | |
| 7,473,989 B2 * | 1/2009 | Yang et al. | 257/678 |
| 2005/0121756 A1 | 6/2005 | Chow et al. | |
| 2006/0175689 A1 | 8/2006 | Shim et al. | |
| 2006/0266546 A1 | 11/2006 | Palmteer | |
| 2007/0001189 A1 | 1/2007 | Chou | |
| 2007/0126020 A1 | 6/2007 | Lin et al. | |
| 2008/0067649 A1 | 3/2008 | Matsunaga et al. | |

FOREIGN PATENT DOCUMENTS

| | | |
|---|---|---|
| CN | 1571151 | 1/2005 |
| DE | 198 37 911 | 3/1999 |
| DE | 199 63 264 | 6/2001 |
| DE | 10 2005 058 880 | 1/2007 |

(Continued)

*Primary Examiner* — Jasmine Clark
(74) *Attorney, Agent, or Firm* — Cozen O'Connor

(57) ABSTRACT

A carrier body for a semiconductor component, in particular for an optoelectronic semiconductor component, is specified. Said carrier body has a connecting layer and a conductor layer, which are connected to one another via main areas facing one another. The connecting layer, the conductor layer or both the connecting layer and the conductor layer has/have at least one thinned region in which the layer thickness of said layer(s) is less than the maximum layer thickness of said layer(s). The connecting layer is either completely electrically conductive and electrically insulated at least from parts of the conductor layer or it is electrically insulating at least in parts. Furthermore, a semiconductor component comprising the electrical connection conductor and also a method for producing the carrier body are specified.

20 Claims, 5 Drawing Sheets

(56) References Cited

FOREIGN PATENT DOCUMENTS

| GB | 2 206 444 | 1/1989 |
|---|---|---|
| JP | 2005-535135 | 11/2005 |
| JP | 2006-310425 | 11/2006 |
| JP | 2008-071815 | 3/2008 |
| WO | WO 02/09180 | 1/2002 |
| WO | WO 2004/004017 | 1/2004 |

* cited by examiner

CARRIER BODY FOR A SEMICONDUCTOR COMPONENT, SEMICONDUCTOR COMPONENT AND METHOD FOR PRODUCING A CARRIER BODY

RELATED APPLICATIONS

This application is a U.S. National Phase Application under 35 USC 371 of International Application PCT/DE2009/001484, filed on 22 Oct. 2009.

This patent application claims the priority of German Patent Application 10 2008 053 489.7 filed 28 Oct. 2008, the disclosure content of which is hereby incorporated by reference.

FIELD OF THE INVENTION

The present application relates to a carrier body suitable for a semiconductor component, and to a method for producing a carrier body. Furthermore, a semiconductor component comprising a carrier body is specified.

BACKGROUND OF THE INVENTION

So-called leadframes are often used for the production of semiconductor components. A leadframe has electrical connection conductors for an electronic component such as, for example, a semiconductor component. The electrical connection conductors are connected and held in the leadframe for example by means of a frame of said leadframe. A leadframe often at least substantially consists of stamped copper sheet. Generally, a leadframe could be referred to as a metal plate in which electrical connection conductors are formed by means of cutouts.

During the production of known semiconductor components, a leadframe is often encapsulated by molding with a basic housing composed of plastic. The basic housing forms a carrier body for the semiconductor chip. The basic housing has at least one first and one second electrical connection conductor formed by the leadframe. The chip mounted on or in the basic housing is subsequently encapsulated with an encapsulating composition, for example. The electrical connection conductors project from the plastic part of the basic housing for example laterally at mutually opposite sides.

SUMMARY OF THE INVENTION

One object is to specify a carrier body for a semiconductor component which can be used more diversely and/or can be produced technically more simply than conventional carrier bodies. Moreover, the intention is to specify a particularly advantageous semiconductor component comprising the carrier body and also a method for producing the carrier body or the semiconductor component.

A carrier body for a semiconductor component, in particular for an optoelectronic semiconductor component, is specified. The carrier body is suitable, in particular, for carrying at least one semiconductor body of the component. It is provided, in particular, as part of a housing of the semiconductor component.

The carrier body has an electrically conductive conductor layer and a connecting layer, which are connected to one another via main areas facing one another. The conductor layer, the connecting layer or both the connecting layer and the conductor layer has/have at least one thinned region in which the layer thickness of said layer(s) is less than the maximum layer thickness of said layer(s).

The connecting layer in the case where it is completely electrically conductive, is electrically insulated at least from parts of the conductor layer.

In accordance with another embodiment, the connecting layer is electrically insulating at least in parts. That is to say that a part of the connecting layer is electrically conductive or the entire connecting layer is electrically insulating.

Both the carrier body and the conductor layer and the connecting layer per se are, in particular, self-carrying or self-supporting elements, that is to say that, in particular in a state in which they are free of further material, they are dimensionally stable and can be moved and transported as such whilst maintaining their form.

Coatings such as, for example, thin metal coatings, plastic coatings or thin layers of transparent, electrically conductive oxides which are applied on material areas do not as such come under the expression "connecting layer" or "conductor layer". This holds true particularly if the coating, in a form in which it is not applied on another material, but rather is free of further material, would not be suitable for customary processing owing to a lack of dimensional stability. However, such coatings can be part of the connecting layer and/or part of the conductor layer as long as the connecting layer and the conductor layer are in each case per se self-supporting or self-carrying elements.

In accordance with one expedient embodiment, both the connecting layer and the conductor layer have a maximum thickness of at least 50 µm, preferably of at least 80 µm or at least 90 µm. That is to say that the conductor layer and/or the connecting layer have/has to have, at at least one location, a thickness that is at least equal in magnitude to one of the thicknesses specified, wherein the thickness is measured perpendicularly to a main extension plane of the conductor layer. Conductor layer and connecting layer can have different thicknesses.

In accordance with at least one embodiment, the connecting layer, the conductor layer or both the connecting layer and the conductor layer is/are a metal plate or has/have a metal plate.

The conductor layer and connecting layer each have a flat form with main areas which lie opposite one another and which are connected to one another by side areas. The side areas are in each case smaller than the main areas.

By virtue of the measure of forming the carrier body at least with two parts in the form of a connecting layer and a conductor layer and providing at least one of the layers with a thinned region, the carrier body can be formed with properties that go beyond conventional properties such as the suitability as a carrier for a semiconductor chip and the fact of merely having an electrical connection conductor.

The expression "thinned region" does not imply a specific production method for the formation of such regions. Although it can be expedient, proceeding from a conductor layer and/or a connecting layer having a constant thickness, to produced thinned regions, for example by removing material, for example by means of etching, or by embossing, this is not absolutely necessary. By way of example, the respective layer can be formed with thinner and thicker regions from the outset.

"Thinned region" is generally defined by the fact that in it the layer thickness of the conductor layer is less than the maximum layer thickness thereof, independently of a production method. Expediently, the thinned region has a thickness that is less than the maximum thickness of the conductor layer by at least 10%, by at least 25% or by at least 35%. By way of example, a thinned region can have a thickness which is approximately 40%, approximately 50% or approximately 60% less than the maximum thickness of the conductor layer.

In accordance with at least one embodiment of the carrier body, the connecting layer is part of a first leadframe and the conductor layer is part of a second leadframe. The two leadframes are connected to one another in an electrically insulating fashion. As already mentioned in the introduction, a leadframe is a metal plate containing a plurality of electrical connection conductors for a semiconductor component, wherein the electrical connection conductors in the metal plate are formed and shaped by means of corresponding cutouts in the plate. The expression "leadframe" is familiar to the person skilled in the art, in particular also to a person skilled in the art in the field of optoelectronics.

The expression "conductor layer" does not necessarily imply a layer in one piece. Rather, the conductor layer can also have a plurality of partial layers which are spaced apart from one another and are arranged alongside one another. The same analogously holds true for the connecting layer.

In accordance with at least one embodiment of the carrier body, the latter has a first side, wherein, at the first side, an encapsulating composition is integrally formed onto the conductor layer and the connecting layer, said encapsulating composition comprising a silicone. In other words, the encapsulating composition then forms a housing composition for the conductor layer and the connecting layer.

Silicones have the advantage of aging to a significantly lesser extent than other encapsulating compositions, for example optoresins, upon irradiation by short-wave electromagnetic radiation. Furthermore, silicones have a considerably increased thermal stability compared with epoxides, for example. While epoxides can typically be heated up to a maximum of approximately 150° C. without incurring damage, it is possible up to approximately 200° C. in the case of silicones.

A silicone having a degree of hardness in the range of Shore A=20 to D=90 with a refractive index of 1.41 to 1.57 is preferably used for the encapsulating composition.

In this case, it is possible for the encapsulating composition to consist of one or more of the silicones described here, wherein radiation-reflecting or radiation-absorbing fillers such as, for example, $TiO_2$ or carbon black can additionally be introduced into the silicone.

Furthermore, hybrid materials such as, for example, mixtures of silicones and epoxides or mixtures of silicones with other organic materials such as, for example, vinyl or acrylate-containing materials are also appropriate for the encapsulating composition.

Hybrid materials of the type described are advantageously radiation-stabler and thermally stabler than pure epoxides and additionally have good mechanical properties (for example toughness) in comparison with pure silicones.

In accordance with at least one embodiment of the carrier body, the latter has a second side, lying opposite the first side, wherein the conductor layer, at the second side, is at least partly free of the encapsulating composition and of electrically insulating material in those regions in which, at the first side, encapsulating composition is integrally formed onto the conductor layer. Preferably, the carrier body is surface-mountable. An external electrical contact-connection can advantageously be effected via the uncovered part of the conductor layer or of the carrier body, that is to say via the second side.

In accordance with at least one further embodiment of the carrier body, the conductor layer has at least two parts which are electrically insulated from one another, which form a first and a second electrical connection conductor for a semiconductor component and which are mechanically connected to one another by means of at least one part of the connecting layer. If the connecting layer is completely electrically conductive or adjoins both electrical connection conductors with an electrically conductive part, it suffices, in principle, for the connecting layer only to be electrically insulated from one of the connection conductors in order that it does not electrically connect the latter.

In accordance with at least one embodiment of the carrier body, both the connecting layer and the conductor layer each have at least one thinned region in which the layer thickness of said layers is less than the maximum layer thickness of said layers. Even greater flexibility with regard to the formation of additional functions or particular forms and structures in the carrier body is made possible as a result.

In one configuration of this embodiment, the thinned region of the connecting layer laterally overlaps the thinned region of the conductor layer. In connection with the present application, laterally means a direction running parallel to a main extension plane of the conductor layer, the connecting layer or the carrier body.

In accordance with at least one further embodiment, the connecting layer and/or the conductor layer have/has at least one perforation. The perforation can be, for example, a hole in the layer or a cutout which extends through the entire thickness of the layer. The cutout can be open on at least one side, that is to say that it is not necessarily surrounded laterally by material of the layer from all sides. In the case where the layer has a plurality of partial layers spaced apart from one another, the cutout is a gap between the partial layers.

In accordance with at least one configuration of this embodiment, the connecting layer and/or the conductor layer have/has a thinned region adjoining the perforation.

In accordance with a further configuration of this embodiment, the conductor layer has a thinned region laterally overlapping the perforation of the connecting layer. The perforation and the thinned region can completely overlap one another. However, they can also only partly overlap one another, that is to say that the perforation can be partly laterally offset with respect to the thinned region.

In accordance with a further configuration, an opening area of the perforation, in a plan view of the connecting layer, is smaller than an area of the thinned region—overlapping the perforation—of the conductor layer in plan view. Plan view means a viewing angle perpendicular to a main extension plane of one of the layers or of the carrier body. Alternatively, in plan view, the opening area of the perforation is larger than the area of the thinned region—overlapping the perforation—of the conductor layer, as seen in plan view in each case.

In accordance with a further embodiment, the connecting layer has a part which laterally projects above a part of the conductor layer, wherein a region between the part of the connecting layer and that part of the conductor layer above which said part of the connecting layer projects laterally is free of material of the carrier body. In particular, a gap is present between the parts.

In one configuration, the part of the connecting layer adjoins the perforation.

In accordance with at least one further configuration of the carrier body, at an edge, a part of the connecting layer is present which laterally projects above a part of the conductor layer, wherein between the part of the connecting layer and the part of the conductor layer there is a region that is free of material of the carrier body. In particular, a gap is present between the parts.

At least one further embodiment of the carrier body provides for the connecting layer and the conductor layer to be connected to one another by means of a connecting means. In one configuration, the connecting means is an electrically insulating material. Additionally or alternatively, it can be a material having good thermal conductivity. The connecting means can advantageously be an adhesive.

In accordance with at least one further embodiment, a chip mounting region is provided on a part of the conductor layer. The connecting layer is disposed downstream of the conductor layer on the side of the chip mounting region. The chip mounting region is provided or formed, in particular, in a depression of the carrier body.

In at least one further embodiment of the carrier body, at least one inner wall is present, the main extension plane of which runs obliquely with respect to a main extension plane of the carrier body or the conductor layer and is tilted toward the chip mounting region compared with said main extension plane. In the case of an optoelectronic component, an inner wall formed in this way can serve as a reflector for an electromagnetic radiation emitted or to be received by a semiconductor chip.

A semiconductor component is specified, comprising the carrier body in at least one of its embodiments or configurations.

The carrier body is provided with a semiconductor chip and with an encapsulating composition on a first side, wherein the encapsulating composition encloses the semiconductor chip and is integrally formed onto the carrier body. In other words, the encapsulating composition can be formed in one piece and encapsulates the chip and also the carrier body in places.

In accordance with one embodiment, the semiconductor component is an optoelectronic semiconductor component. In this case, the semiconductor chip is suitable, in particular, for emitting and/or receiving an electromagnetic radiation.

In accordance with at least one further embodiment of the semiconductor component, the carrier body, on a second side lying opposite the first side, is at least partly free of the encapsulating composition and of possible other insulating material in a region laterally overlapping the encapsulating composition and/or the encapsulating composition and the semiconductor chip. That is to say that the electrical connection conductor—that is to say for example the conductor layer or the carrier body—on the second side is at least partly free of the encapsulating composition in those regions in which encapsulating composition is present on the first side lying opposite. The uncovered part of the carrier body on its second side functions, in particular, as an external electrical connection of the semiconductor component.

In accordance with one configuration of the semiconductor component, the carrier body is completely free of encapsulating composition on the second side.

Embodiments in which the connection conductor, in the region of the encapsulating composition, is completely enclosed by the latter and a further part of the connection conductor projects from the encapsulating composition and is bent onto a rear side of the encapsulating composition do not come under the embodiment described previously. In principle, however, the semiconductor component can also comprise such features.

In accordance with a further configuration of the semiconductor component, a region of the carrier body on the second side which laterally overlaps the semiconductor chip is free of the encapsulating composition and also free of other electrically insulating material.

The semiconductor chip is a light-emitting diode chip, in particular, wherein the expression "light-emitting diode chip" is not restricted to chips which emit visible light, but rather is used generally for all semiconductor chips which emit electromagnetic radiation. The semiconductor chip has, in particular, an epitaxial semiconductor layer sequence comprising an active layer in which the electromagnetic radiation is generated.

In accordance with a further embodiment, the encapsulating composition is embodied such that it is largely or completely radiation-transmissive. In the radiation-transmissive parts, it has a transmittance of at least 50%, preferably of at least 70%, for an electromagnetic radiation from the wavelength spectrum of the semiconductor chip.

In accordance with at least one further embodiment of the semiconductor component, the carrier body laterally overlaps the encapsulating composition completely or to the extent of at least 80%, preferably to the extent of at least 90%.

A method for producing a carrier body for a semiconductor component is specified. The method involves providing a connecting layer and a conductor layer. The conductor layers in each case have main areas facing away from one another. The connecting layer and the conductor layer are connected to one another via two of their main areas in such a way that said main areas face one another. The process of connecting the connecting layer and the conductor layer is effected, in particular, after the process of providing the conductor layers. Furthermore, in the connecting layer, the conductor layer or both in the connecting layer and in the conductor layer, at least one thinned region is formed in which the layer thickness of the corresponding conductor layer is less than the maximum layer thickness thereof.

The layers are connected and/or the material constitution of said layers is such that they are electrically insulated from one another. The connecting layer is partly or completely electrically conductive or electrically insulating.

The process of forming the thinned region can be effected before or after the process of connecting the connecting layer and the conductor layer to one another. The process of forming the thinned region can, in particular, also be effected during the process of providing the corresponding layer, for example during the production of the layer. The layer can be formed with a thinned region from the outset. However, the thinned region can, in particular, also be formed by material removal or by material deformation.

BRIEF DESCRIPTION OF THE DRAWINGS

Further advantages, preferred embodiments and developments of the carrier body, of the semiconductor component and of the method will become apparent from the exemplary embodiments explained below in conjunction with the figures.

In the figures.

DETAILED DESCRIPTION OF THE DRAWINGS

In the exemplary embodiments and figures, identical or identically acting constituent parts are in each case provided with the same reference symbols. The constituent parts illustrated and also the size relationships of the constituent parts among one another should not be regarded as true to scale. Rather, some details of the figures are illustrated with an exaggerated size in order to afford a better understanding.

Figure 1:
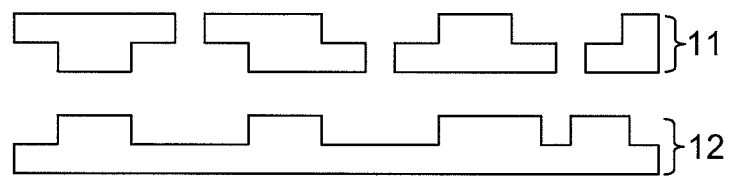
FIG. 1 shows a schematic sectional view of the connecting layer and of the conductor layer during a method stage for producing the carrier body or the semiconductor component in accordance with a first exemplary embodiment.

A connecting layer 11 and a conductor layer 12 are illustrated schematically in FIG. 1. Both the connecting layer and the conductor layer have a plurality of thinned regions, which is explained below in connection with FIG. 2. The connecting layer 11 additionally has a plurality of perforations. The perforations can be embodied as holes, for example. However, they can also be cutouts which are open on at least one side or which separate the different parts of the connecting layer 11 that are visible in FIG. 1 from one another. In other words, the connecting layer 11 can also have a plurality of mutually separate parts. The same applies to the conductor layer 12.

Figure 2:
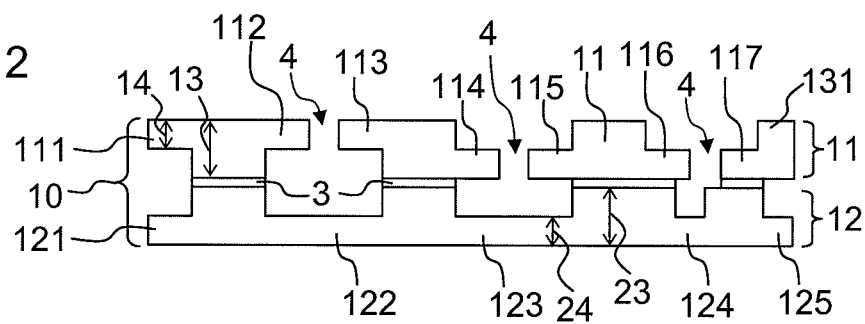
FIG. 2 shows a schematic sectional view of the carrier body in accordance with the first exemplary embodiment with the layers illustrated in FIG. 1.

FIGS. 1 and 2 serve principally for illustrating some structures which can advantageously be realized in a technically simple manner with the carrier body. FIG. 2 does not necessarily illustrate a carrier body which is optimized for a semiconductor component, even though it would in principle be suitable for such a semiconductor component.

Both the connecting layer and the conductor layer comprise electrically conductive material, for example. In particular, the layers can also consist completely of electrically conductive material. Alternatively, one of the layers or both layers can also consist only partly of electrically conductive material. Preferably, however, at least the conductor layer consists largely or electrically conductive material, for example to the extent of more than 50%, more than 75% or more than 80%. The same can apply to the connecting layer.

The conductor layer 12 and the connecting layer 11 comprise metallic material, for example, or consist of such a material. Both layers can largely consist of copper, for example. In addition, the conductor layers can for example be coated with at least one further metal, for example gold, silver or tin.

Alternatively, the connecting layer 11 can also completely consist of an electrically insulating material or comprise such a material. Examples of insulating materials are ceramic materials or plastics. If the connecting layer 11 consists only partly of an electrically insulating material, the latter can, for example, be integrated in the connecting layer 11 in such a way that the electrically conductive part of the connecting layer 11 in the carrier body 10 is electrically insulated from the conductor layer even when the layers 11, 12 are connected to one another for example by means of an electrically conductive connecting means 3, see FIG. 2. The same can also apply, in principle, to the constitution of the conductor layer.

In one expedient exemplary embodiment, both the connecting layer 11 and the conductor layer 12 are parts of a leadframe which, for example, is mechanically interconnected completely in an electrically insulating fashion. The leadframes consist of metal and comprise copper, for example.

The maximum thickness of both layers 11, 12 or of one of the layers is, for example, 0.1 mm, 0.15 mm or 0.2 mm. In particular, a conductor layer 12 and a connecting layer 11 having different maximum thicknesses can be used. By way of example, the connecting layer 11 can have a maximum thickness 13 of approximately 0.15 mm and the conductor layer 12 can have a maximum thickness 23 of 0.4 mm, or vice versa.

In order to produce the carrier body 10, the connecting layer and the electrical conductor layer 11, 12 are connected to one another by means of a connecting material 3, see FIG. 2. The connecting material 3 is for example electrically insulating, for example an adhesive. However, in principle it is also possible to use, for example, an electrically conductive connecting means 3 such as a solder or an electrically conductive adhesive. This can depend, for example, on whether an electrically insulating connecting means is required for ensuring that parts of the conductor layer which are possibly intended to be insulated from one another in the carrier body are electrically insulated from one another. In principle, an electrically conductive connecting means can also be combined with an electrically insulating connecting means.

At least some of the thinned regions of the connecting layer 11 and some of the perforations 4 could, in principle, also first be produced after the connecting layer 11 and the conductor layer 12 have been connected to one another by means of the connecting means 3.

As can be discerned in FIG. 2, the carrier body 10, through the use of at least two layers 11, 12, can, in a technically simple manner, be provided with a multiplicity of three-dimensional structures which, in a different manner, would not be able to be realized, or would only be able to be realized with a significantly higher outlay. In principle, besides the connecting layer 11 and the conductor layer 12, the carrier body can have even further layers, for example a total of three or four layers.

In the case of the carrier body 10 illustrated in FIG. 2, the connecting layer 11 has, at a first edge, a thinned region 111, which projects laterally above a thinned region 121 of the conductor layer 12. Between the thinned region 111 of the connecting layer and the thinned region 121 of the conductor layer there is a region that is free of material of the carrier body. In the illustration in FIG. 2, the complete region between the thinned regions at the edge 111, 121 is free of material of the connection conductor. However, a part of this region could also have material of the connection conductor; by way of example, connecting material 3 could project into the region.

In the case of a component to be produced, such a gap at an edge of the carrier body can act like an anchoring element for an encapsulating composition, by means of which the risk of a delamination of encapsulating composition and electrical connection conductor can be significantly reduced. The other structures of the electrical connection conductor illustrated in FIG. 2 can also act as an anchoring element for an encapsulating composition if the respective gaps between parts of the connecting layer 11 and the conductor layer 12 are at least partly filled by an encapsulating composition.

The thinned regions 112, 113 of the connecting layer 11 which are illustrated in FIG. 2 adjoin a perforation 4. Moreover, they each project laterally above a part of a thinned region 122 of the conductor layer 12. There is respectively a gap between them. Moreover, a depression is thus also formed in the carrier body 10. The cross-sectional area of the depression increases, as seen in a plan view, in the progression from an outer side of the connecting layer 11 toward the conductor layer 12.

Such depressions can be used, for example, as a pure anchoring element of the carrier body 10, that is to say that the depression can be free of a semiconductor chip in the case of a semiconductor component. In addition, however, the bottom of such a depression can also be used a mounting area for a semiconductor chip which is correspondingly arranged in the depression.

A further depression is formed in the center of the carrier body 10 in accordance with FIG. 2. In the case of this depression, thinned regions 114, 115 of the connecting layer adjoin a perforation 4 and laterally project above a thinned region 123 of the conductor layer 12. There is a gap between the thinned regions 114, 115 of the connecting layer 11 and the thinned region 123 of the conductor layer 12. In contrast to the depression described previously, this depression has a different progression of the size of the cross-sectional area. Proceeding from the outer side of the connecting layer 11, the cross-sectional area of the depression initially decreases within the perforation and becomes larger again in the region of the conductor layer 12.

In contrast to the thinned regions 112, 113, the thinned regions 114, 115 of the connecting layer which adjoin the perforation 4 are formed in a part of the conductor layer 11 which faces the conductor layer 12 and which forms a main area of the connecting layer 11 via which the connecting layer 11 is connected to the conductor layer 12.

In the exemplary embodiment of a carrier body as illustrated in FIG. 2, a further thinned region 116 of the connecting layer 11 is present, which laterally projects above a part of the conductor layer 12. In this case, however, only a part of the region between the thinned region 116 and that part of the conductor layer 12 above which it projects is free of material of the carrier body 10. This is realized by virtue of the fact that a thinned region 124 of the conductor layer 12 only partly overlaps the thinned region 116. The thinned region 124 of the conductor layer 12 also only partly laterally overlaps a further perforation 4 adjoined by the thinned region 116.

By means of such partial lateral overlaps, effectively smaller structure elements such as, for example, projecting-away parts or openings can be formed in the carrier body 10 than respectively in one of the layers 11, 12. If, by way of example, the thinned regions and the perforations are produced by means of etching in conductor layers composed of metal, then a minimum size of a lateral extent of the thinned regions and of the perforation is of the order of magnitude of the maximum thickness of the unstructured conductor layer.

At a second edge of the carrier body 10, the connecting layer 11 has an unthinned part 118, which laterally projects above a part 125 of the conductor layer 12, there being a gap between these parts 118, 125 of the conductor layers 11, 12. This gap, too, can serve as an anchoring element for an encapsulating composition.

FIGS. 3 to 6 in each case illustrate an exemplary embodiment of a semiconductor component. The semiconductor component is for example an optoelectronic component, for example a light-emitting diode component. It has a carrier body 10 in each case.

The carrier body 10 contains a conductor layer 12, which forms a first electrical connection conductor 21 in a first part and a second electrical connection conductor 22 in a second part. The first electrical connection conductor 21 has in each case a chip mounting region 5, on which a semiconductor chip 50 is mechanically and electrically conductively mounted. The connection conductors 21, 22 are electrically insulated from one another; they are laterally spaced apart from one another, for example.

The carrier body 10 additionally contains a connecting layer 11. The latter connects for example the electrical connection conductors 21, 22 mechanically, but not electrically to one another.

The semiconductor chip 50 is a light-emitting diode chip, for example. The latter has, for example, an epitaxial semiconductor layer sequence comprising an active layer. The active layer can be composed, in particular, of a plurality of partial layers which, in particular, can also have different material compositions.

The semiconductor layer sequence comprises, for example, III/V compound semiconductor materials. A III/V compound semiconductor material comprises at least one element from the third main group, such as, for example, B, Al, Ga, In, and an element from the fifth main group, such as, for example, N, P, As. In particular, the term "III/V compound semiconductor material" comprises the group of the binary, ternary or quaternary compounds which contain at least one element from the third main group and at least one element from the fifth main group, for example nitride and phosphide compound semiconductors. In addition, such a binary, ternary or quaternary compound can comprise, for example, one or more dopants and additional constituents.

The active layer preferably comprises a pn-junction, a double heterostructure, a single quantum well (SQW) or, particularly preferably, a multi quantum well (MQW) structure for generating radiation. In this case, the designation quantum well structure does not exhibit any significance with regard to the dimensionality of the quantization. It therefore encompasses, interalia, quantum wells, quantum wires and quantum dots and any combination of these structures. Examples of MQW structures are known to the person skilled in the art.

In the exemplary embodiments illustrated in the figures, the chip mounting region 5 is in each case formed on an outer area of the conductor layer 12 of the first carrier body 10. The connecting layer 11 succeeds the conductor layer 12 on the side of the chip mounting region 5. Consequently, the semiconductor chip 50 is in each case at least partly laterally surrounded by material of the carrier body 10. In other words, it is arranged in a depression of the carrier body 10.

On the side of the chip mounting region 5 and of the semiconductor chip 50, the carrier body 10 and the semiconductor chip 50 are provided with an encapsulating composition 9 of the semiconductor component. The encapsulating composition 9 encapsulates the semiconductor chip 50 and is integrally formed onto the carrier body 10. On a side of the carrier body 10 that lies opposite the chip mounting region 5, said carrier body is free of the encapsulating composition and of other electrically insulating material. This region of the outer area of the carrier body 10 serves, by way of example, as a first external electrical contact area 81 in the region of the first connection conductor 21 and as a second external electrical contact area of the semiconductor component in the region of the second connection conductor 22.

A perforation 4 of the conductor layer 12 is in each case present between the electrical connection conductors 21, 22, which perforation separates the electrical connection conductors from one another. In the exemplary embodiments in accordance with FIGS. 3, 5 and 6, thinned parts 123, 124 of the conductor layer adjoin the perforation 4, such that the cross section of the perforation becomes smaller in the progression toward the connecting layer 11. Consequently, the distance between the electrical connection conductors 21, 22 is larger on the outside than in the vicinity of the connecting layer, as a result of which it is possible to prevent short circuits during the electrical mounting of the semiconductor component, without the stability of the carrier body 10 being significantly impaired. In FIG. 4, the entire perforation 4 of the conductor layer 12 has a constant cross-sectional area, for example.

Figure 3:
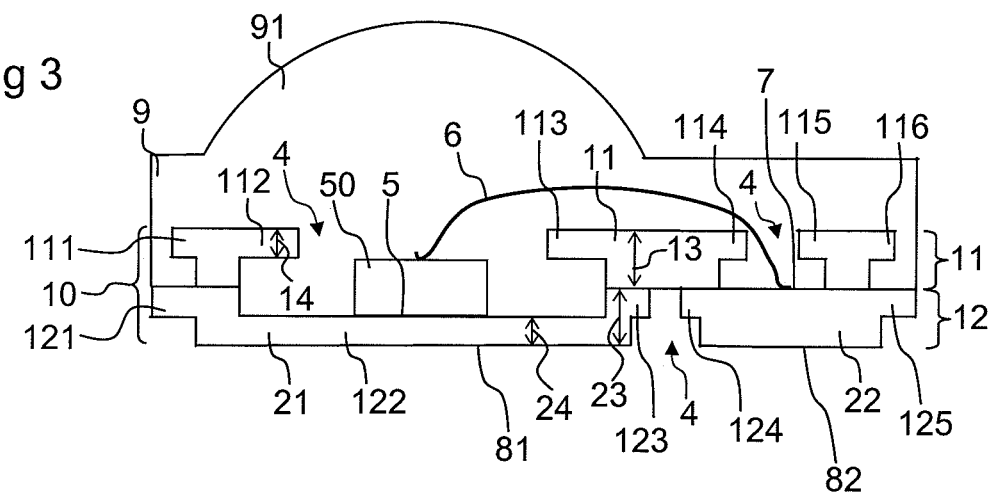
FIG. 3 shows a schematic sectional view of the semiconductor component in accordance with a first exemplary embodiment.
Figure 4:
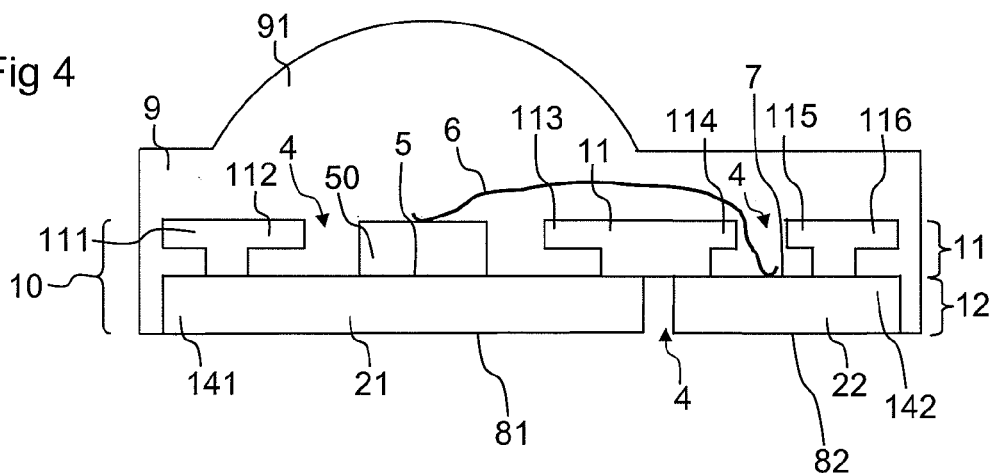
FIG. 4 shows a schematic sectional view of the semiconductor component in accordance with a second exemplary embodiment.
Figure 5:
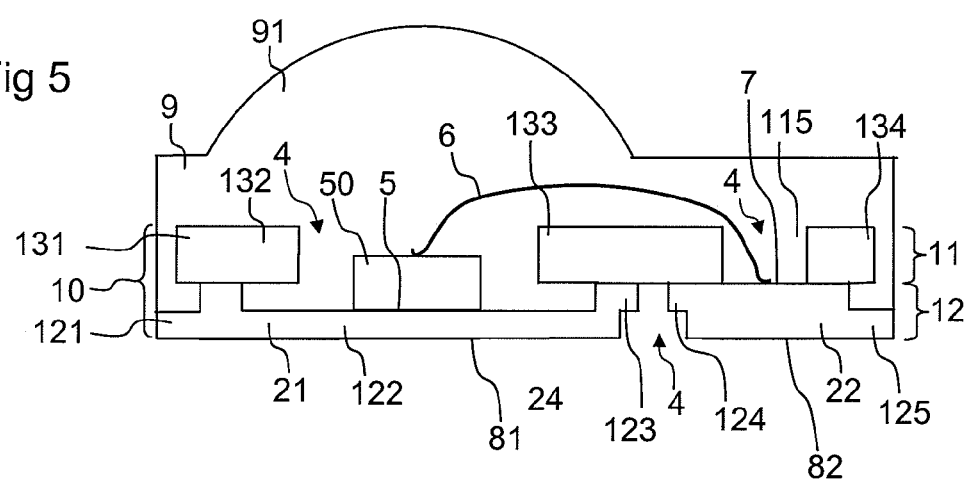
FIG. 5 shows a schematic sectional view of the semiconductor component in accordance with a third exemplary embodiment.
Figure 6:
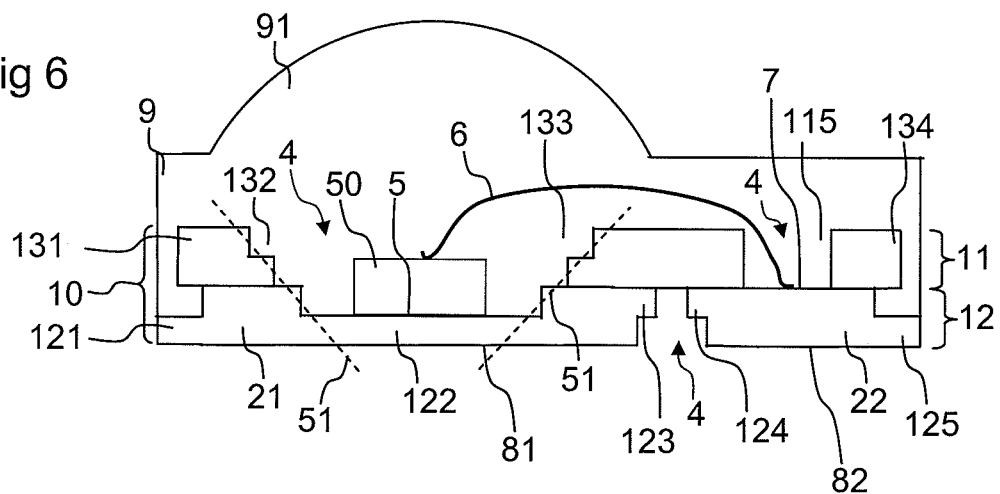
FIG. 6 shows a schematic sectional view of the semiconductor component in accordance with a fourth exemplary embodiment.

In the exemplary embodiments illustrated in FIGS. 3, 5 and 6, the chip mounting region 5 is formed on an outer area of a thinned region 122 of the conductor layer 12.

If the chip mounting region 5 is formed on an outer area of a thinned region 122 of the conductor layer 12, the distance between the chip mounting region 5 and the external electrical connection area 81 can advantageously be realized such that it is particularly small. It is thereby possible to achieve a particularly low thermal resistance between the semiconductor chip 50 and the electrical connection area 81, which can have a positive effect on the operation, the power and the durability of the semiconductor component.

A particularly low thermal resistance can generally be realized, however, whenever the chip mounting region 5 is formed on an outer area of the conductor layer (that is to say the "lower" layer facing away from the main emission direction), independently of whether the chip mounting region is formed in an unthinned region or a thinned region. If, by way of example, the conductor layer substantially consists of copper, the thickness of the conductor layer is of only minor importance for the thermal resistance.

In the exemplary embodiment of the semiconductor component as illustrated in FIG. 4, the chip mounting region 5 is formed on an outer area of a part of the conductor layer 12 whose thickness corresponds to a maximum thickness 23 of the conductor layer.

The semiconductor component in accordance with FIG. 4 has, for example, a conductor layer 12 of the carrier body 10 which contains no thinned regions. In this case, the conductor layer 12 can be formed for example from a metal plate having a substantially constant thickness. The connecting layer 11 of the exemplary embodiment illustrated in FIG. 5 likewise has no thinned regions, for example. Consequently, in these exemplary embodiments, only one of the two layers has to be provided with thinned regions, which can simplify production.

In the exemplary embodiments illustrated in FIGS. 3, 4 and 5, the depression in which the semiconductor chip 50 is arranged is embodied in each case as an anchoring element in which gaps are present between parts of the connecting layer 11 and parts of the conductor layer 12 above which said parts of the connecting layer project laterally, said gaps being filled by the encapsulating composition 9.

In contrast thereto, the exemplary semiconductor component illustrated in FIG. 6 has a depression with edges which can function as reflectors. In the exemplary embodiment in accordance with FIG. 6, the chip mounting region 5 is surrounded by at least two inner walls of the depression, the main extension plane 51 of which runs obliquely with respect to a main extension plane of the carrier body 10 and is tilted toward the chip mounting region 5 compared with the main extension plane of the carrier body 10.

In FIG. 6, the inner walls are illustrated such that they are formed from a plurality of rectangular steps. In reality, however, very generally they are not rectangular steps but rather partly curved and rounded areas. Concave curvatures arise, for example, if the perforation 4, the thinned regions 112, 113 of the connecting layer and the thinned region 122 of the conductor layer 121 are formed in a metal plate of substantially constant thickness by means of etching. A schematic exemplary illustration of such concave curvatures of the steps of an inner wall is given in the excerpt shown in FIG. 7.

Figure 7:
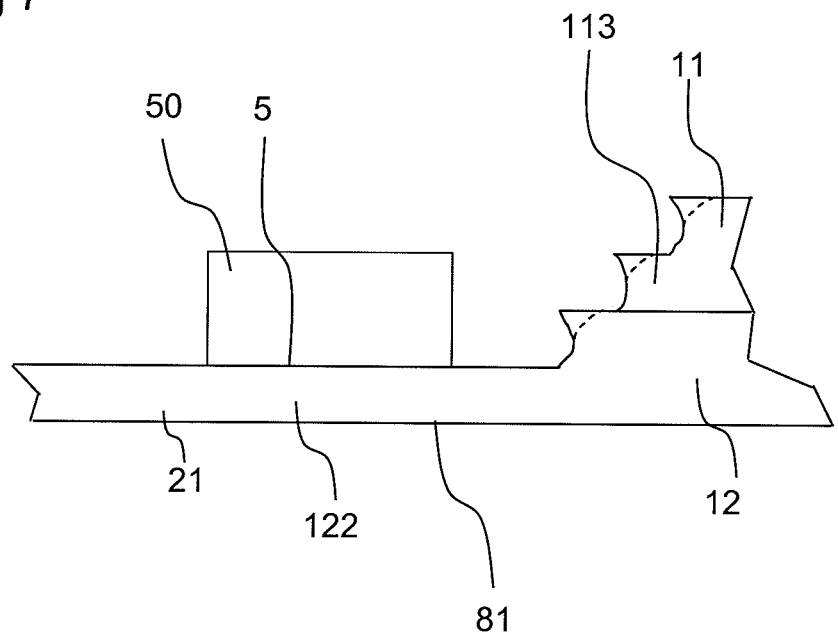
FIG. 7 shows an exemplary excerpt from the component illustrated in FIG. 4 in a schematic sectional view.

The inner walls can also be formed in some other way. Moreover, additional measures can be taken to smooth the inner walls. FIG. 7 illustrates by way of example, by means of dashed lines, how the progression or the form of a smoothed inner wall might appear. Smoothing or removal of the edges can be effected, for example, by means of electropolishing or similar methods. The inner walls are largely shaped in such a way that electromagnetic radiation from the semiconductor chip 50 can be deflected in an emission direction of the semiconductor component at said inner walls.

If inner walls of the connection conductor 10 are embodied as a reflector, as illustrated by way of example in FIGS. 6 and 7, then it is advantageous if the bottom of the depression, on which the chip mounting region 50 is formed, is as deep as possible in order that the "reflectors" reach as high as possible above the chip 5. By way of example, the thinned region 122 of the conductor layer 12 is thinner than the maximum thickness of the conductor layer by at least 60%, by at least 70% or by at least 80%. Additionally or alternatively, the entire carrier body 10 has, for example, a total thickness of at least 0.5 mm, of at least 0.75 mm or at least 1 mm. The total thickness of the carrier body 10 can be overall at most 1 mm thick.

The encapsulating composition 9 comprises silicone, for example, or at least largely consists thereof. A part of the encapsulating composition 9 is shaped to form a lens 91, for example. The encapsulating composition 9 in each case laterally completely encloses for example the carrier body 10 and the second electrical connection conductor 20 and completely covers the connection conductors 10, 20 from one side, as illustrated in FIG. 4.

Alternatively, the encapsulating composition 9 does not laterally enclose the conductor layer 12, as illustrated in FIG. 3, or laterally encloses it only partly, as illustrated in FIGS. 5 and 6. In these examples, the encapsulating composition is spaced apart for example vertically from the external connection areas 81, 82.

The encapsulating composition 9 can likewise partly cover for example a side of the carrier body which faces away from the semiconductor chip 50, contrary to the illustrations in the figures. However, in this case, too, a part of the external connection areas 81, 82 of the electrical connection conductors 21, 22 remains free of the encapsulating composition 9 and forms an electrical connection area 81 in the case of the first connection conductor 21 and an electrical connection area 82 in the case of the second electrical connection conductor 22.

The semiconductor chip 50 is electrically conductively connected to an internal electrical connection area 7 of the second electrical connection conductor 22 by means of a bonding wire 6, for example. On a side lying opposite the internal electrical connection area 7, the second electrical connection conductor has an external electrical connection area 82 that is free of insulating material. Instead of a bonding wire 6, in principle it is also possible to use other electrical connecting means for electrically conductively connecting the semiconductor chip 50 to the second electrical connection conductor 22.

In all the exemplary embodiments, the carrier body has at the edges respectively a part 111, 131, 116, 134 of the connecting layer 11 which laterally projects above a part 121, 125, 141, 142 of the conductor layer 12, wherein a gap is present between the respective parts, said gap being free of material of the carrier body. In the examples in accordance with FIGS. 3, 5 and 6, the connecting layer 11 for example only partly laterally projects above the parts 121, 125 of the conductor layer at the edges of the carrier body 10 in the region of the gap. By contrast, a further, outer part of the conductor layer 12 is laterally offset with respect to the connecting layer 11.

In the region of the second connection conductor 22, the connecting layer 11 respectively has a perforation 4. As a result, the internal contact area 7 can be contact-connected from the side of the connecting layer 11. In the case of the exemplary embodiments illustrated in FIGS. 5 and 6, said perforation 4 has, for example, in each case a constant cross-sectional area, as seen in plan view.

In the case of the exemplary embodiments illustrated in FIGS. 3 and 4, however, the depressions are formed analogously to the depression in the region of the first connection conductor 21 as an anchoring element or with anchoring elements for the encapsulating composition 9. In this case, the cross section of the perforation 4 increases in the progression toward the conductor layer. Parts 114, 115 of the connecting layer 11 project laterally above parts of the conductor layer 12 and a gap is in each case present between said parts, said gap being free of material of the carrier body.

Figure 8:
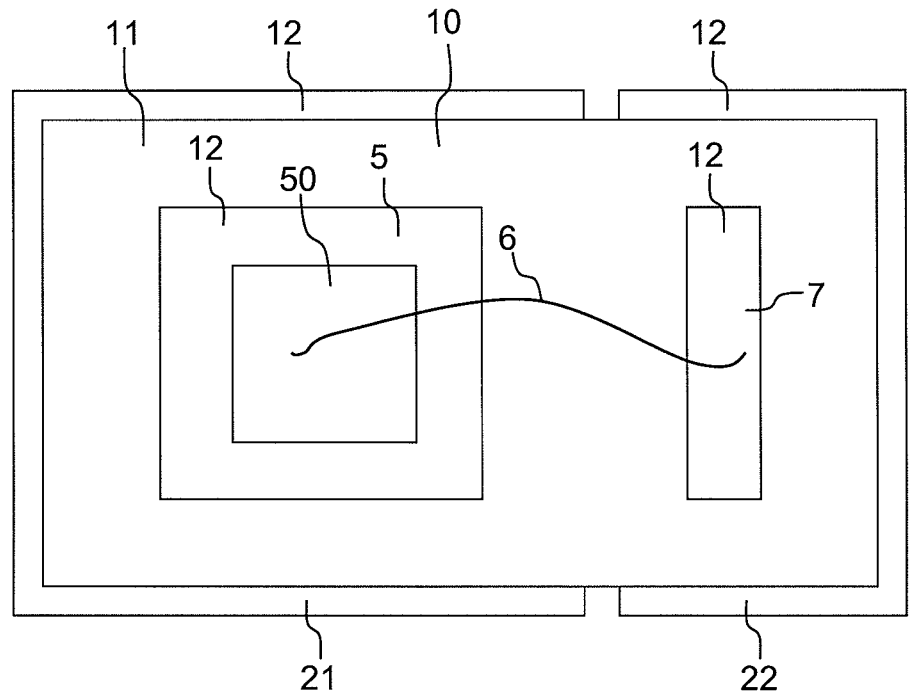
FIG. 8 shows a first exemplary schematic plan view of the semiconductor component illustrated in FIG. 3.

In FIG. 8 there is a first exemplary embodiment of a plan view of the semiconductor component illustrated in FIG. 3. In the case of this exemplary embodiment, the semiconductor chip 50 is laterally completely surrounded by the connecting layer 11 and, if appropriate, by parts of the conductor layer 12. In other words, a depression of the carrier body 10 in which the semiconductor chip 50 is arranged is present, said depression having inner walls on all sides. Such a depression is also present in the region of the second connection conductor 22, for example.

Figure 9:
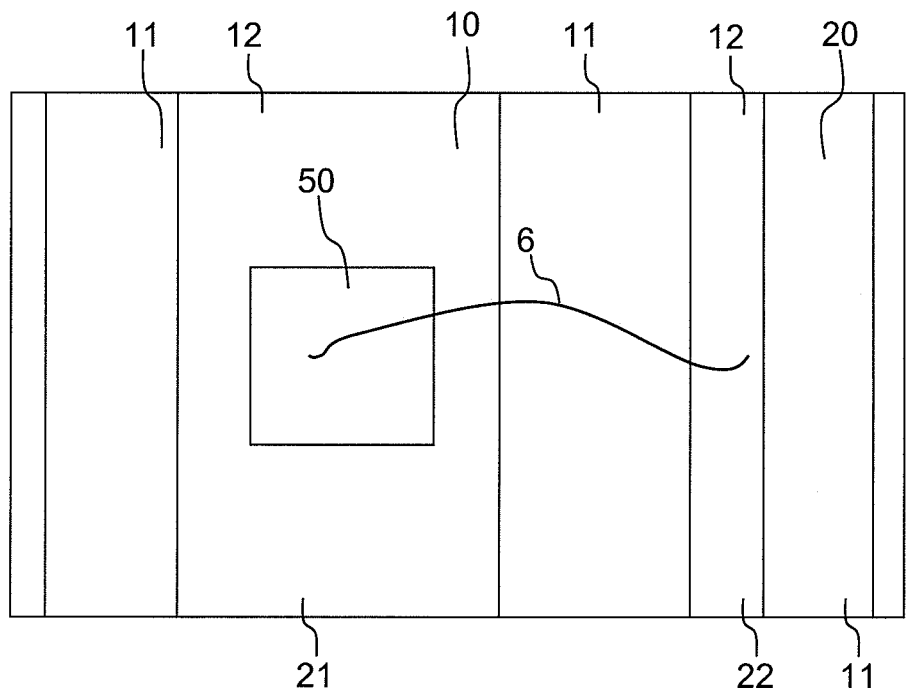
FIG. 9 shows a second exemplary schematic plan view of the semiconductor component illustrated in FIG. 3.

In contrast thereto, in the case of the plan view illustrated in FIG. 9, the depression in which the semiconductor chip 50 is arranged is a trench open at two opposite sides. The same correspondingly holds true for example for the depression in the region of the second connection conductor 22. In the case of an exemplary embodiment of this type, the sectional view in accordance with FIG. 3 could alternatively also be a lateral plan view of the semiconductor component since the depression is laterally open at two sides. The depression can alternatively also be laterally open only on one side.

In the case of all the exemplary embodiments, the conductor layer and the connecting layer can be embodied with different materials, metalizations, material coatings and/or surface roughnesses. By way of example, the surface of the connecting layer, at least in partial regions, has a roughness that is greater by at least 50%, at least 100%, or at least 150%, than the surface of the conductor layer.

The conductor layer has for example a metal coating, for example a layer sequence comprising different metal layers. The layer sequence comprises, for example, proceeding from a basic body of the conductor layer in this order, a nickel layer, a palladium layer and a gold layer, wherein each of the layers can additionally also comprise other materials in addition to nickel, palladium and gold. Alloys, in particular are possible. A metal coating of this type has, for example, a good suitability for soldering and adhesive bonding and also for bonding of bonding wires.

The conductor layer has a basic body, for example, which comprises copper or consists of copper. Additionally or alternatively, the connecting layer largely comprises copper or the connecting layer completely consists of copper. The surface of copper oxidizes rapidly and, in the oxidized state, has good adhesion to encapsulating compositions, such as, for example, encapsulating compositions which comprise silicone or consist of silicone. However, the connecting layer can likewise have a metal coating analogously to the above-described metal coating of the conductor layer.

Figure 10:
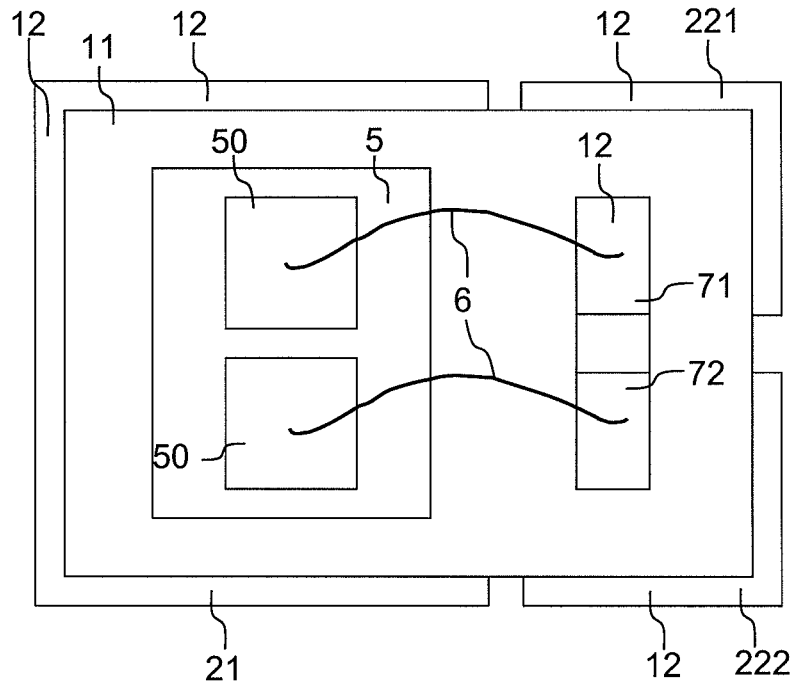
FIG. 10 shows a schematic plan view of the semiconductor component in accordance with a fifth exemplary embodiment.
Figure 11:
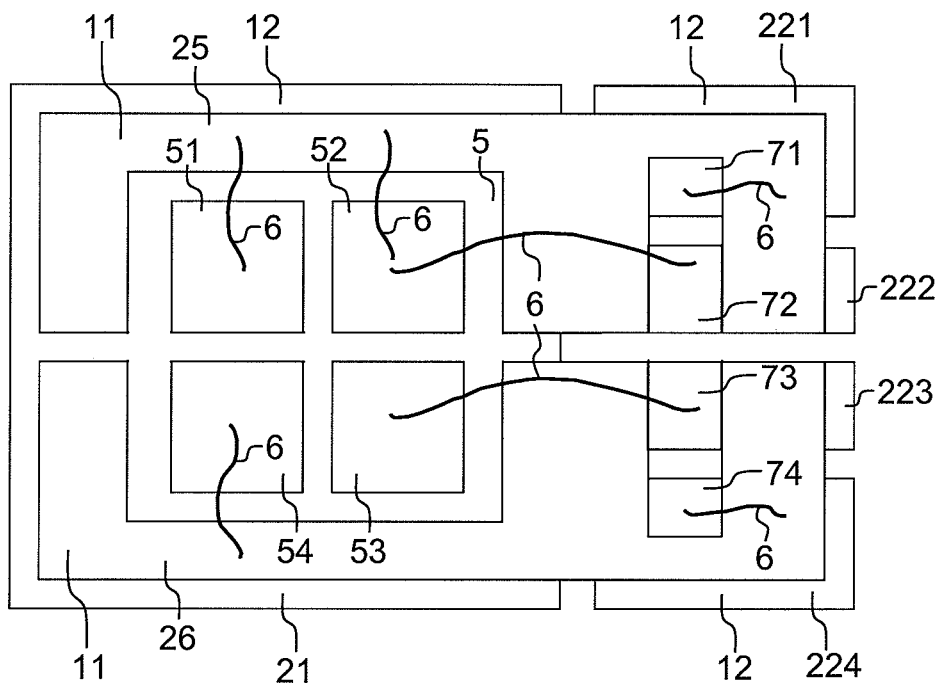
FIG. 11 shows a schematic plan view of the semiconductor component in accordance with a sixth exemplary embodiment.

In the case of the exemplary embodiments illustrated in FIGS. 10 and 11, the semiconductor component in each case has a plurality of semiconductor chips 50, 51, 52, 53, 54. The semiconductor component is embodied for example in such a way that at least some of the semiconductor chips or all the semiconductor chips are externally drivable independently of one another.

This is realized, for example, by virtue of the fact that the conductor layer 12 has at least three parts 21, 221, 222 electrically insulated from one another, as illustrated in FIG. 10. A first part 21 of the conductor layer 12 serves as first connection conductor, for example, on which the semiconductor chips 50 are connected mechanically and, by a connection side, also electrically conductively to the connection area 5 of the first electrical connection conductor 21. The semiconductor chips 50 are soldered on the first connection conductor 21, for example.

A second part 221 of the conductor layer 12 serves as second electrical connection conductor, for example, and a third part 222 of the conductor layer 12 serves as third electrical connection conductor of the carrier body and of the component, for example. One of the semiconductor chips 50 is for example electrically conductively connected to the second connection conductor 221, for example by means of a bonding wire 6 of by means of some other electrical connecting means. The second of the semiconductor chips 50 is for example electrically conductively connected to the third connection conductor 222, for example likewise by means of a bonding wire 6 or by means of some other electrical connecting means.

All the parts of the conductor layer 12 are mechanically connected to one another by means of the connecting layer 11, for example.

At least some of the semiconductor chips can, in principle, also be electrically conductively connected to electrical connection conductors of the carrier body indirectly via the connecting layer. By way of example, at least one semiconductor chip is electrically conductively connected to the connecting layer and the connecting layer is electrically conductively connected to the corresponding connection conductor.

One example of this is illustrated in FIG. 11. The semiconductor component has four semiconductor chips 51, 52, 53, 54, for example, which are all mounted on a first connection conductor 21 of the conductor layer 12. The conductor layer 12 has, for example, five electrical connection conductors 21, 221, 222, 223, 224 electrically insulated from one another. The connecting layer has, for example, two electrically conductive parts 25, 26 electrically insulated from one another. The two parts 25, 26 of the connecting layer mechanically connect the connection conductors 21, 221, 222, 223, 224 to one another. The first connection conductor 21 mechanically connects the two parts 25, 26 of the connecting layer to one another, such that the carrier body of the component is a continuous part.

A first semiconductor chip 51 is electrically conductively connected to a second connection conductor 221 of the conductor layer 12 indirectly via the connecting layer 11. The connecting layer can be electrically connected to an internal connection area 71 of the second connection conductor 221 by means of a bonding wire 6, for example. Alternatively, an electrically conductive connecting means can be arranged between the connecting layer 11 and the second connection conductor 221, said connecting means electrically conductively connecting said part 25 of the connecting layer 11 and the connection conductor 224 to one another. The same analogously holds true for the second part 26 of the connecting layer, which is electrically insulated from the first part 25, and a fifth connection conductor 224 of the conductor layer 12. A fourth semiconductor chip 54 is electrically conductively connected to the fifth connection conductor 224 indirectly via the second part 26 of the connecting layer 11.

A second semiconductor chip 52 is electrically connected to a third electrical connection conductor 222 directly by means of a connecting means such as a bonding wire 6. A third semiconductor chip 53 is electrically connected to a fourth electrical connection conductor 223 of the conductor layer directly by means of a connecting means such as a bonding wire 6.

The second semiconductor chip 52 can optionally additionally be electrically conductively connected to the second connection conductor, for example indirectly via the first part 25 of the connecting layer 11. As a result, both the first semiconductor chip 51 and the second semiconductor chip 52 are put into operation if an electrical voltage is applied between the first connection conductor 21 and the second connection conductor 221. Independently of this, it is also possible for only the second semiconductor chip alone to be put into operation via the first and the third connection conductor 21, 222.

As far as the electrical interconnections are concerned, any desired combinations of the features described are possible. The number of semiconductor chips and connection conductors is not restricted. Moreover, the connecting layer can have more than two parts electrically insulated from one another.

All the embodiments of the carrier body and of the semiconductor component can also be realized, in principle, with a conductor layer and a connecting layer, neither of which have a thinned region.

The invention is not restricted to the exemplary embodiments by the description of the invention on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A carrier body for a semiconductor component, comprising an electrically conductive conductor layer and a connecting layer, which are connected to one another via main areas facing one another, wherein the connecting layer is completely electrically conductive and is electrically insulated at least from parts of the conductor layer or the connecting layer is electrically insulating at least in parts, wherein the conductor layer, the connecting layer or both the conductor layer and the connecting layer has/have at least one thinned region in which the layer thickness of said layer(s) is less than the maximum layer thickness of said layer(s),
   wherein both the conductor layer and the connecting layer each have at least one thinned region in which the layer thickness of said layers is less than the maximum layer thickness of said layers, and, in particular, the thinned region of the conductor layer laterally overlaps the thinned region of the connecting layer.

2. The carrier body according to claim 1, having a first side, wherein, at the first side, an encapsulating composition is integrally formed onto the conductor layer and the connecting layer, said encapsulating composition comprising a silicone.

3. The carrier body according to claim 2, having a second side, lying opposite the first side, wherein the conductor layer, at the second side, is at least partly free of the encapsulating composition and of electrically insulating material in regions in which, at the first side, encapsulating composition is integrally formed onto the conductor layer.

4. The carrier body according to claim 1, wherein the conductor layer has at least two parts which are electrically insulated from one another, which form a first and a second electrical connection conductor for a semiconductor component and which are mechanically connected to one another by at least one part of the connecting layer.

5. The carrier body according to claim 1, wherein the conductor layer is part of a first leadframe, the connecting layer is part of a second leadframe and the two leadframes are connected to one another in an electrically insulating fashion.

6. The carrier body according to claim 1, wherein the connecting layer or the conductor layer or both the connecting layer and the conductor layer have a perforation and a thinned region adjoining the perforation.

7. The carrier body according to claim 1, wherein the connecting layer has a perforation and the conductor layer has a thinned region and the perforation laterally overlaps the thinned region of the conductor layer.

8. The carrier body according to claim 1, wherein the conductor layer has a perforation and a part which adjoins the perforation and which laterally projects above a part of the conductor layer, wherein a region between these parts is free of material of the carrier body.

9. The carrier body according to claim 1, wherein, at an edge, a part of the connecting layer is present which laterally projects above a part of the conductor layer, and a region between these parts is free of material of the carrier body.

10. The carrier body according to claim 1, wherein a chip mounting region is provided on a part of the conductor layer and the connecting layer is displaced downstream of the conductor layer on the side of the chip mounting region, and, in particular, at least one inner wall is present, the main extension plane of which runs obliquely with respect to a main extension plane of the carrier body or of the conductor layer of the electrical connection conductor and is tilted toward the chip mounting region compared with said main extension plane.

11. The carrier body according to claim 1, wherein the conductor layer and the connecting layer are connected to one another by a connecting means.

12. A semiconductor component comprising a carrier body according to claim 1, wherein the conductor layer is provided with a semiconductor chip and with an encapsulating composition on a first side, and the encapsulating composition encloses the semiconductor chip and is integrally formed onto the carrier body.

13. The semiconductor component according to claim 12, wherein the conductor layer, on a second side lying opposite the first side, is free of the encapsulating composition and of electrically insulating material in a region laterally overlapping the encapsulating composition or the encapsulating composition and the semiconductor chip.

14. A method for producing a carrier body, comprising the steps of:
   providing a conductor layer and a connecting layer, which in each case have two main areas facing away from one another; connecting the conductor layer to the connecting layer via two of their main areas in such a way that said main areas face one another, wherein the connecting layer is electrically conductive and is electrically insulated from the connecting layer or the connecting layer is electrically insulating; and forming at least one thinned region in the conductor layer, the connecting layer or both the conductor layer and the connecting layer, in which region the layer thickness of the corresponding layer is less than the maximum layer thickness thereof, arranging both the conductor layer and the connecting layer to each have at least one thinned region in which the layer thickness of said layers is less than the maximum layer thickness of said layers, and, in particular, the thinned region of the conductor layer laterally overlaps the thinned region of the connecting layer.

15. A carrier body for a semiconductor component, comprising an electrically conductive conductor layer and a connecting layer, which are connected to one another via main areas facing one another, wherein the connecting layer is completely electrically conductive and is electrically insulated at least from parts of the conductor layer or the connecting layer is electrically insulating at least in parts, wherein the conductor layer, the connecting layer or both the conductor layer and the connecting layer has/have at least one thinned region in which the layer thickness of said layer(s) is less than the maximum layer thickness of said layer(s), wherein the conductor layer has at least two parts which are electrically insulated from one another, which form a first and a second electrical connection conductor for a semiconductor component and which are mechanically connected to one another by at least one part of the connecting layer.

16. A carrier body for a semiconductor component, comprising an electrically conductive conductor layer and a connecting layer, which are connected to one another via main areas facing one another, wherein the connecting layer is completely electrically conductive and is electrically insulated at least from parts of the conductor layer or the connecting layer is electrically insulating at least in parts, wherein the conductor layer, the connecting layer or both the conductor layer and the connecting layer has/have at least one thinned region in which the layer thickness of said layer(s) is less than the maximum layer thickness of said layer(s), wherein the conductor layer is part of a first leadframe, the connecting layer is part of a second leadframe and the two leadframes are connected to one another in an electrically insulating fashion.

17. A carrier body for a semiconductor component, comprising an electrically conductive conductor layer and a connecting layer, which are connected to one another via main areas facing one another, wherein the connecting layer is completely electrically conductive and is electrically insulated at least from parts of the conductor layer or the connecting layer is electrically insulating at least in parts, wherein the conductor layer, the connecting layer or both the conductor layer and the connecting layer has/have at least one thinned region in which the layer thickness of said layer(s) is less than the maximum layer thickness of said layer(s), wherein the connecting layer has a perforation and the conductor layer has a thinned region and the perforation laterally overlaps the thinned region of the conductor layer.

18. A carrier body for a semiconductor component, comprising an electrically conductive conductor layer and a connecting layer, which are connected to one another via main areas facing one another, wherein the connecting layer is completely electrically conductive and is electrically insulated at least from parts of the conductor layer or the connecting layer is electrically insulating at least in parts, wherein the conductor layer, the connecting layer or both the conductor layer and the connecting layer has/have at least one thinned region in which the layer thickness of said layer(s) is less than the maximum layer thickness of said layer(s), wherein the conductor layer has a perforation and a part which adjoins the perforation and which laterally projects above a part of the conductor layer, wherein a region between these parts is free of material of the carrier body.

19. A carrier body for a semiconductor component, comprising an electrically conductive conductor layer and a connecting layer, which are connected to one another via main areas facing one another, wherein the connecting layer is completely electrically conductive and is electrically insulated at least from parts of the conductor layer or the connecting layer is electrically insulating at least in parts, wherein the conductor layer, the connecting layer or both the conductor layer and the connecting layer has/have at least one thinned region in which the layer thickness of said layer(s) is less than the maximum layer thickness of said layer(s), wherein, at an edge, a part of the connecting layer is present which laterally projects above a part of the conductor layer, and a region between these parts is free of material of the carrier body.

20. A carrier body for a semiconductor component, comprising an electrically conductive conductor layer and a connecting layer, which are connected to one another via main areas facing one another, wherein the connecting layer is completely electrically conductive and is electrically insulated at least from parts of the conductor layer or the connecting layer is electrically insulating at least in parts, wherein the conductor layer, the connecting layer or both the conductor layer and the connecting layer has/have at least one thinned region in which the layer thickness of said layer(s) is less than the maximum layer thickness of said layer(s), wherein a chip mounting region is provided on a part of the conductor layer and the connecting layer is displaced downstream of the conductor layer on the side of the chip mounting region, and, in particular, at least one inner wall is present, the main extension plane of which runs obliquely with respect to a main extension plane of the carrier body or of the conductor layer of the electrical connection conductor and is tilted toward the chip mounting region compared with said main extension plane.

* * * * *